United States Patent
Yoshikawa (10) Patent No.: US 11,322,189 B2
(45) Date of Patent: May 3, 2022

(54) MAGNETIC MEMORY DEVICE

(71) Applicant: Kioxia Corporation, Tokyo (JP)

(72) Inventor: Masatoshi Yoshikawa, Seoul (KR)

(73) Assignee: KIOXIA CORPORATION, Tokyo (JP)

(*) Notice: Subject to any disclaimer, the term of this patent is extended or adjusted under 35 U.S.C. 154(b) by 86 days.

(21) Appl. No.: 16/904,080

(22) Filed: Jun. 17, 2020

(65) Prior Publication Data
US 2020/0321040 A1 Oct. 8, 2020

Related U.S. Application Data

(62) Division of application No. 16/126,823, filed on Sep. 10, 2018, now abandoned.

(30) Foreign Application Priority Data

Mar. 16, 2018 (JP) .............................. JP2018-049873

(51) Int. Cl.
| | |
|---|---|
| *H01L 43/10* | (2006.01) |
| *G11C 11/16* | (2006.01) |
| *H01L 43/08* | (2006.01) |
| *H01L 43/02* | (2006.01) |

(52) U.S. Cl.
CPC ............ *G11C 11/161* (2013.01); *H01L 43/02* (2013.01); *H01L 43/08* (2013.01); *H01L 43/10* (2013.01)

(58) Field of Classification Search
CPC .... H01L 27/224; H01L 27/222; H01L 27/226
See application file for complete search history.

(56) References Cited

U.S. PATENT DOCUMENTS

| | | |
|---|---|---|
| 6,967,863 B2 | 11/2005 | Huai |
| 8,995,181 B2 | 3/2015 | Watanabe et al. |
| 9,070,855 B2 | 6/2015 | Gan et al. |

(Continued)

FOREIGN PATENT DOCUMENTS

| | | |
|---|---|---|
| JP | 2007525033 A | 8/2007 |
| JP | 2008010590 A | 1/2008 |

(Continued)

OTHER PUBLICATIONS

Chikako Yoshida et al., "Reduction of Offset Field in Top-Pinned MTJ With Synthetic Antiferromagnetic Free Layer", IEEE Transactions on Magnetics (vol. 50, No. 11), Nov. 2014, 4 pages.

(Continued)

*Primary Examiner* — Mounir S Amer
*Assistant Examiner* — Alexander Belousov
(74) *Attorney, Agent, or Firm* — Holtz, Holtz & Volek PC (57) ABSTRACT

According to one embodiment, a magnetic memory device includes a first magnetic layer having a variable magnetization direction, a second magnetic layer having a fixed magnetization direction, and a nonmagnetic layer between the first magnetic layer and the second magnetic layer, wherein the first magnetic layer includes a first sub-magnetic layer, a second sub-magnetic layer, and a first intermediate layer between the first sub-magnetic layer and the second sub-magnetic layer, and the first sub-magnetic layer is provided between the nonmagnetic layer and the second sub-magnetic layer and has a magnetization direction antiparallel to a magnetization direction of the second sub-magnetic layer and has a magnetization amount smaller than that of the second sub-magnetic layer.

16 Claims, 5 Drawing Sheets

(56) References Cited

U.S. PATENT DOCUMENTS

| | | |
|---|---|---|
| 9,231,027 B2 | 1/2016 | Gan et al. |
| 9,252,357 B2 | 2/2016 | Watanabe et al. |
| 9,385,304 B2 | 7/2016 | Nakayama et al. |
| 9,396,781 B2 | 7/2016 | Zhou et al. |
| 9,608,038 B2 | 3/2017 | Wang et al. |
| 9,748,471 B2 | 8/2017 | Zhou et al. |
| 10,090,456 B2 | 10/2018 | Huai et al. |
| 10,304,509 B2 | 5/2019 | Yoshikawa et al. |
| 10,522,590 B2 | 12/2019 | Satoh et al. |
| 2014/0042571 A1 | 2/2014 | Gan et al. |
| 2014/0151827 A1 | 6/2014 | Zhou et al. |
| 2014/0183608 A1 | 7/2014 | Gan et al. |
| 2014/0286084 A1 | 9/2014 | Watanabe et al. |
| 2015/0069558 A1 | 3/2015 | Nakayama et al. |
| 2015/0102441 A1 | 4/2015 | Gan et al. |
| 2015/0179926 A1 | 6/2015 | Watanabe et al. |
| 2015/0270311 A1 | 9/2015 | Gan et al. |
| 2016/0284762 A1 | 9/2016 | Wang et al. |
| 2017/0155040 A1 | 6/2017 | Noh |
| 2017/0162781 A1 | 6/2017 | Zhou et al. |
| 2017/0256706 A1 | 9/2017 | Toko et al. |
| 2017/0324027 A1 | 11/2017 | Huai et al. |
| 2019/0156875 A1 | 5/2019 | Ohmori et al. |
| 2019/0280195 A1 | 9/2019 | Sonoda |
| 2019/0288031 A1 | 9/2019 | Satoh et al. |
| 2020/0083291 A1 | 3/2020 | Yoshikawa |

FOREIGN PATENT DOCUMENTS

| | | |
|---|---|---|
| JP | 4970113 B2 | 7/2012 |
| JP | 6237162 B2 | 11/2017 |

OTHER PUBLICATIONS

L. Thomas et al., "Spin transfer torque driven dynamics of the synthetic antiferromagnetic reference layer of perpendicular MRAM devices", 2017 IEEE International Magnetics Conference (INTERMAG), Apr. 24-28, 2017, p. 294.

Léa Cuchet et al., "Perpendicular magnetic tunnel junctions with a synthetic storage or reference layer: A new route towards Pt- and Pd-free junctions", Scientific Reports (vol. 6, No. 21246), Feb. 17, 2016, pp. 1-9, Downloaded from: https://www.nature.com/articles/srep21246.

Léa Cuchet et al., "Perpendicular magnetic tunnel junctions with double barrier and single or synthetic antiferromagnetic storage layer", Journal of Applied Physics (vol. 117, No. 23), Jun. 15, 2015, pp. (233901-1)-(233901-5).

MAGNETIC MEMORY DEVICE

CROSS-REFERENCE TO RELATED APPLICATIONS

This application is a Divisional application of U.S. application Ser. No. 16/126,823, filed on Sep. 10, 2018, which is based upon and claims the benefit of priority from Japanese Patent Application No. 2018-049873, filed Mar. 16, 2018, the entire contents both of which are incorporated herein by reference.

FIELD

Embodiments described herein relate generally to a magnetic memory device.

BACKGROUND

A magnetic memory device (semiconductor integrated circuit device) in which a magnetoresistive element and a transistor are integrated on a semiconductor substrate has been proposed. The magnetoresistive element includes a storage layer having a variable magnetization direction, a reference layer having a fixed magnetization direction, and a tunnel barrier layer provided between the storage layer and the reference layer.

As a magnetoresistive element, an STT (spin transfer torque) type magnetoresistive element using a spin transfer torque effect (spin transfer torque magnetization reversal) has been proposed. In the STT type magnetoresistive element, the magnetization direction of the storage layer is reversed by passing a current perpendicular to the film surface of each layer constituting the magnetoresistive element. In this case, it is necessary to prevent the magnetization direction of the reference layer from being reversed even if the magnetization direction of the storage layer is reversed.

When, as described above, magnetization of the storage layer is reversed using spin transfer torque magnetization reversal, the magnetization direction of the reference layer needs to be fixed. That is, compared with the storage layer, the reference layer needs to be sufficiently stable. However, in the spin transfer torque magnetization reversal in which a current is passed through the magnetoresistive element to perform magnetization reversal of the storage layer, spin torque is applied to the storage layer. After the magnetization direction of the storage layer is reversed, spin torque also acts on the reference layer as its reaction. As a result, the magnetization direction of the reference layer may be reversed. In particular, when the magnetoresistive element is refined, the probability that the magnetization direction of the reference layer is reversed tends to increase. Therefore, as the magnetoresistive element is refined, a normal operation of the magnetoresistive element becomes increasingly difficult.

Therefore, there is a demand for a magnetic memory device capable of preventing the reversal of the magnetization direction of the reference layer even when the element is refined.

DETAILED DESCRIPTION

In general, according to one embodiment, a magnetic memory device includes: a first magnetic layer having a variable magnetization direction; a second magnetic layer having a fixed magnetization direction; and a nonmagnetic layer provided between the first magnetic layer and the second magnetic layer, wherein the first magnetic layer includes a first sub-magnetic layer, a second sub-magnetic layer, and a first intermediate layer provided between the first sub-magnetic layer and the second sub-magnetic layer, and the first sub-magnetic layer is provided between the nonmagnetic layer and the second sub-magnetic layer and has a magnetization direction antiparallel to a magnetization direction of the second sub-magnetic layer and has a magnetization amount smaller than that of the second sub-magnetic layer.

Hereinafter, embodiments will be described with reference to the drawings.

First Embodiment

Figure 1:
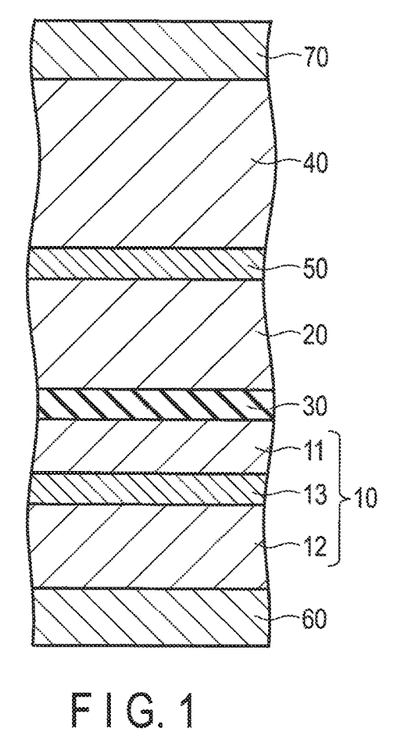
FIG. 1 is a sectional view schematically showing the configuration of a magnetic memory device according to a first embodiment.

FIG. 1 is a sectional view schematically showing the configuration of a magnetic memory device according to a first embodiment and mainly shows the configuration of a magnetoresistive element. The magnetoresistive element is also called a magnetic tunnel junction (MTJ) element.

The magnetoresistive element shown in FIG. 1 includes a storage layer (first magnetic layer) 10, a reference layer (second magnetic layer) 20, a tunnel barrier layer (nonmagnetic layer) 30 provided between the storage layer 10 and the reference layer 20, a shift canceling layer 40, and an intermediate layer 50 provided between the reference layer 20 and the shift canceling layer (third magnetic layer) 40. The storage layer 10 is provided on an underlayer 60 and a cap layer 70 is provided on the shift canceling layer 40.

The storage layer (first magnetic layer) 10 has a variable magnetization direction and includes a first sub-magnetic layer 11, a second sub-magnetic layer 12, and an intermediate layer (first intermediate layer) 13 provided between the first sub-magnetic layer 11 and the second sub-magnetic layer 12. The variable magnetization direction means that the magnetization direction varies for a predetermined write current. The first sub-magnetic layer 11 is provided between the tunnel barrier layer 30 and the second sub-magnetic layer 12 and has a magnetization direction antiparallel to the magnetization direction of the second sub-magnetic layer 12. Also, the first sub-magnetic layer 11 has a magnetization amount Mst smaller than that of the second sub-magnetic layer 12. The first sub-magnetic layer 11 may have a thickness t smaller than that of the second sub-magnetic layer 12 or the first sub-magnetic layer 11 may have saturation magnetization Ms smaller than that of the second sub-magnetic layer 12. Incidentally, the magnetization amount Mst corresponds to the product (Ms×t) of the saturation magnetization Ms and the thickness t.

Each of the first sub-magnetic layer 11 and the second sub-magnetic layer 12 contains at least cobalt (Co). In addition to cobalt (Co), the first sub-magnetic layer 11 and the second sub-magnetic layer 12 may further contain iron (Fe) or boron (B). In the present embodiment, the first sub-magnetic layer 11 and the second sub-magnetic layer 12 are formed of CoFeB.

In the present embodiment, it is preferable that the first sub-magnetic layer 11 contains Fe at least 50 at % near the tunnel barrier layer 30 in view of an improvement of the TMR ratio. Further, in a case of a magnetic layer which contains B, it is preferable that the Co/Fe composition ratio is smaller than 1.0. It is more preferable that the Fe ratio is at least 80 at %. Furthermore, it is preferable that the first sub-magnetic layer 11 contains Co at least 50 at % near the interface between the first sub-magnetic layer 11 and the intermediate layer 13. It is preferable that the second sub-magnetic layer 12 contains Co at least 50 at % near the interface between the second sub-magnetic layer 12 and the intermediate layer 13. In a case of a magnetic layer which contains B, it is preferable that the Co/Fe composition ratio is at least 1.0. In a case where a composition near the interface of the intermediate layer 13 is Co rich, an antiparallel coupling between the first sub-magnetic layer 11 and the second sub-magnetic layer 12 via the intermediate layer 13, that is an antiferromagnetic coupling, can be more stabilized. Specifically, an exchange coupling constant Jex, which is a physical constant of a magnetic coupling, can be improved. The composition ratio of Fe and Co of each magnetic layer can be decided by a composition analysis using XPS, SIMS, EDX or EELS. Further, the saturation magnetization Ms of each of the first sub-magnetic layer 11 and the second sub-magnetic layer 12 is normally controlled within a range from 600 to 2100 emu/cc. The saturation magnetization can be appropriately controlled by a composition of Co, Fe, and B, and the maximum saturation magnetization Ms can be obtained at a composition ration of about Fe:Co=70:30. In a case where Ms of each of the sub-magnetic layer is low, a stability of antiparallel state is improved. Accordingly, Ms of each of the sub-magnetic layers 11 and 12 is preferably 1000 emu/cc, and more preferably 800 emu/cc. In the CoFeB layer of the present embodiment, B is contained 30 at % or less. In order to reduce the saturation magnetization Ms of the magnetic layer, an adding of B is effective. On the other hand, in order to stabilize an antiparallel coupling between the first sub-magnetic layer 11 and the second sub-magnetic layer 12 via the intermediate layer 13, that is, an antiferromagnetic coupling, it is preferable to decrease a ratio of B. In other word, in order to improve an exchange coupling constant Jex, it is preferable to decrease a ratio of B. Accordingly, it is preferable that the ratio of B is 10 at % or less near the interface between the intermediate layer 13 and the first sub-magnetic layers 11 and near the interface between the intermediate layer 13 and the second sub-magnetic layers 12.

The intermediate layer (first intermediate layer) 13 contains at least one element selected from ruthenium (Ru), rhodium (Rh), osmium (Os), and iridium (Ir). More specifically, the intermediate layer 13 may be formed of a single layer film of a ruthenium (Ru) film, a rhodium (Rh) film, an osmium (Os) film, or an iridium (Ir) film or a laminated film arbitrarily combining the ruthenium (Ru) film, the rhodium (Rh) film, the osmium (Os) film, and the iridium (Ir) film. Also, the intermediate layer 13 may be formed of an alloy film containing at least one of ruthenium (Ru), rhodium (Rh), osmium (Os), and iridium (Ir). The thickness of the intermediate layer 13 is preferably 1 nm or less. The first sub-magnetic layer 11 and the second sub-magnetic layer 12 are antiferromagnetically coupled via the intermediate layer 13. Further, a Pt layer, Pd layer, Au layer, or Cu layer may be stacked on the intermediate layer 13. In a case where the intermediate layer 13 has a face-centered cubic (FCC) structure, the intermediate layer 13 has a crystal orientation in which a (111) face is preferentially oriented. In a case where the intermediate layer 13 has a hexagonal close-packed (HCP) structure, the intermediate layer 13 has a crystal orientation in which a (001) face is preferentially oriented.

The reference layer (second magnetic layer) 20 has a fixed magnetization direction. The fixed magnetization direction means that the magnetization direction does not vary for a predetermined write current. The reference layer 20 is formed of a first sub-magnetic layer containing at least iron (Fe), cobalt (Co), and boron (B) and a second sub-magnetic layer containing cobalt (Co) and at least one element from platinum (Pt), nickel (Ni), iron (Fe), and palladium (Pd). In the present embodiment, the reference layer 20 is formed of a stacked film of CoFeB and Co/Pt (or Co/Ni or Co/Pd).

The tunnel barrier layer (nonmagnetic layer) 30 is interposed between the storage layer 10 and the reference layer 20 and contains magnesium (Mg) and oxygen (O). In the present embodiment, the tunnel barrier layer 30 is formed of MgO. The MgO layer of the tunnel barrier layer 30 has a crystal orientation in which a (001) face is preferentially oriented.

The shift canceling layer (third magnetic layer) 40 has a fixed magnetization direction antiparallel to the magnetization direction of the reference layer 20. It is possible to cancel the magnetic field applied from the reference layer 20 to the storage layer 10 by the magnetic field from the shift canceling layer 40. The shift canceling layer 40 contains cobalt (Co) and at least one element from platinum (Pt), nickel (Ni), iron (Fe), and palladium (Pd). In the present embodiment, the shift canceling layer 40 is formed of Co/Pt, Co/Ni, or Co/Pd.

The intermediate layer 50 is interposed between the reference layer 20 and the shift canceling layer 40 and is formed of ruthenium (Ru).

Both the underlayer 60 and the cap layer 70 are formed of a conductive material. A bottom electrode (not shown) is connected to the underlayer 60 and a top electrode (not shown) is connected to the cap layer 70.

In the present embodiment, as described above, the first sub-magnetic layer 11 has a magnetization amount Mst smaller than that of the second sub-magnetic layer 12. With the above configuration, in the present embodiment, the total stray magnetic field from the storage layer 10 to the reference layer 20 can be reduced so that the magnetization direction of the reference layer 20 can be effectively prevented from being reversed. That is, a stable reference layer 20 can be obtained. At this point, the reference layer 20 obtains a sufficiently large Hoff. Hereinafter, a description thereof is provided.

Figure 2:
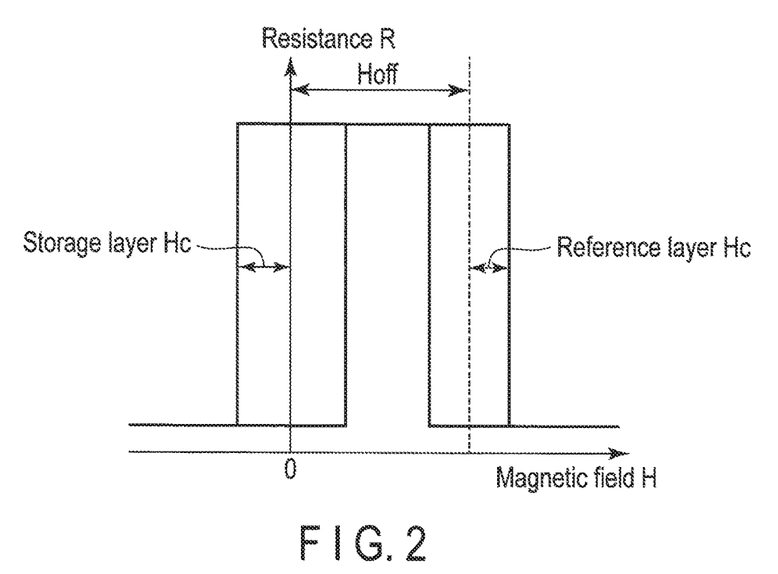
FIG. 2 is a diagram showing an RH loop.

FIG. 2 is a diagram showing a general R-H (resistance-magnetic field) loop. The horizontal axis represents the magnetic field H and the vertical axis represents the resistance R. Both the storage layer and the reference layer draw a hysteresis loop. The width amount of the hysteresis loop of the storage layer and the reference layer is called coercive force Hc. In order to reverse the magnetization of only the storage layer in a stable manner, a magnetic field exceeding the Hc of the storage layer or corresponding spin torque is applied. Also, the hysteresis loop of the reference layer is shifted by the magnetic field Hoff. Basically, the Hoff depends on an antiferromagnetic coupling magnetic field between the shift canceling layer and the reference layer, which is weakened by the stray magnetic field from the storage layer and the shift canceling layer. When the magnetic field H is small, the magnetization direction of the reference layer is not reversed, but when the magnetic field H becomes larger than (Hoff+Hc of the reference layer), the magnetization direction of the reference layer is reversed. Therefore, in order to operate the magnetoresistive element normally, a sufficiently large Hoff is needed and it is necessary to prevent the magnetization of the reference layer from being reversed by the spin torque applied to the reference layer. However, as the magnetoresistive element is refined, the stray magnetic field from the storage layer and the shift canceling layer increases and Hoff becomes small.

In general, Hoff is expressed as:

$Hoff=Hex-Hs1-Hs2$ $Hs1>0$ $Hs2>0.$ where, Hex is an exchange coupling field and $Hex=2Jex/Mst>0.$ Hs1 is a stray magnetic field from the shift canceling layer, which increases as the saturation magnetization Ms of the shift canceling layer and the thickness t of the shift canceling layer increase. Hs2 is a stray magnetic field from the storage layer and increase as the saturation magnetization Ms of the storage layer and the thickness t of the storage layer increase.

The exchange coupling magnetic field Hex depends on a material characteristic Jex. Also, the stray magnetic field Hs1 from the shift canceling layer is automatically determined by the Mst of the shift canceling layer and the size of the magnetoresistive element. Therefore, in order to improve Hoff, the stray magnetic field Hs2 from the storage layer needs to be reduced.

In order to obtain a sufficiently stable reference layer characteristic and perform the spin transfer torque magnetization reversal of the storage layer in a sufficiently stable manner, a sufficiently large Hoff is needed. In order to maximize Hoff, it is necessary to reduce the stray magnetic field from the storage layer and the shift canceling layer. In particular, since the film thickness of the storage layer is thinner than that of the shift canceling layer and the center of gravity of the magnetization amount thereof is closer to the reference layer than that of the shift canceling layer, reducing the stray magnetic field of the storage layer is effective in stabilizing the reference layer.

Figure 3:
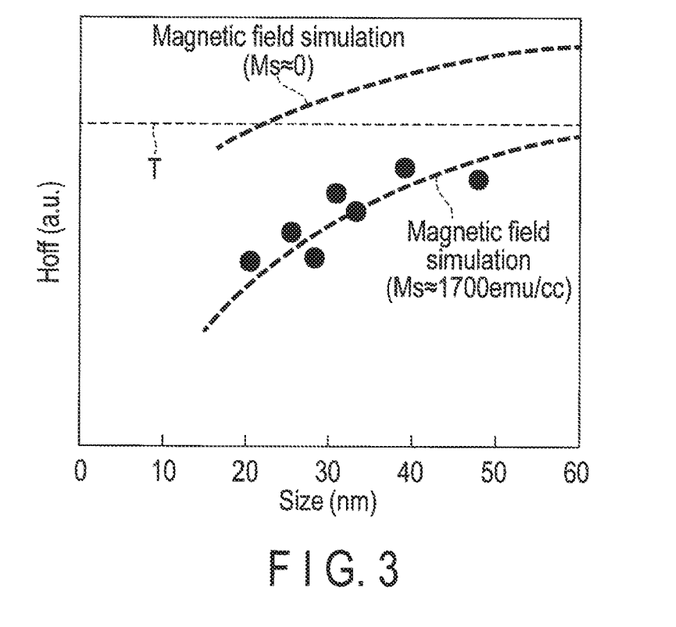
FIG. 3 is a diagram showing the relationship between the size of a magnetoresistive element and Hoff.
Figure 4:
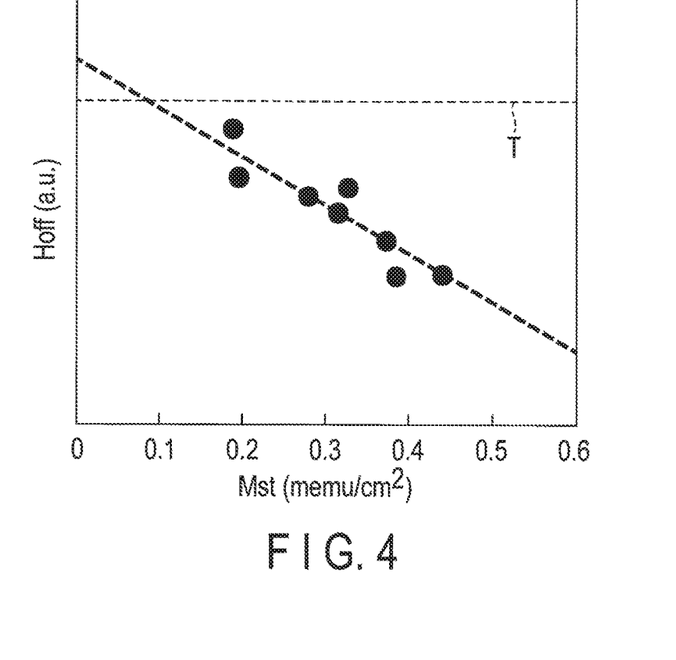
FIG. 4 is a diagram showing the relationship between Mst and Hoff of the storage layer.

FIGS. 3 and 4 are diagrams showing the above-mentioned problems and show simulation results when the storage layer is formed as a single layer.

FIG. 3 is a diagram showing the relationship between the size of the magnetoresistive element and Hoff. With a decreasing size of the magnetoresistive element, the value of Hoff also decreases. When the value of the saturation magnetization Ms is 1700 emu/cc, as the size of the magnetoresistive element decreases, the value of Hoff is far below a target line T.

FIG. 4 is a diagram showing the relationship between Mst and Hoff of the storage layer. As Mst of the storage layer increases, the value of Hoff falls significantly below the target line T.

In the present embodiment, the value of Hoff is prevented from becoming small due to the configuration shown in FIG. 1. That is, in the present embodiment, the storage layer 10 is formed of the first sub-magnetic layer 11, the second sub-magnetic layer 12, and the intermediate layer 13 between the first sub-magnetic layer 11 and the second sub-magnetic layer 12 and the magnetization direction of the first sub-magnetic layer 11 and the magnetization direction of the second sub-magnetic layer 12 are antiparallel to each other. Therefore, it is possible to reduce the total stray magnetic field of the storage layer 10 (ideally, to zero).

However, since the second sub-magnetic layer 12 is farther from the reference layer 20 than the first sub-magnetic layer 11, if Mst of the first sub-magnetic layer 11 and Mst of the second sub-magnetic layer 12 are equal, the total stray magnetic field from the storage layer 10 with respect to the reference layer 20 cannot be reduced to zero. In the present embodiment, since the first sub-magnetic layer 11 has a magnetization amount Mst smaller than that of the second sub-magnetic layer 12, the total stray magnetic field from the storage layer 10 with respect to the reference layer 20 can be reduced to zero. It is preferable that the film thickness t be the same and the saturation magnetization Ms of the first sub-magnetic layer 11 be larger than the saturation magnetization Ms of the second sub-magnetic layer 12 even if both sub-magnetic layers have the same Mst. This is because the centers of gravity of the magnetization amounts of the first sub-magnetic layer 11 and the second sub-magnetic layer 12 become closer to each other, which makes it easier to control the stray magnetic field originating therefrom. By using, for example, the Slater-Pauling rule, the saturation magnetization of the first sub-magnetic layer 11 and the second sub-magnetic layer 12 can be manipulated by using an alloy using Co and Fe as the main components. Therefore, according to the present embodiment, even if the magnetoresistive element is refined, it is possible to effectively suppress the reversal of the magnetization direction of the reference layer.

In addition, according to the present embodiment, it is also possible to reduce the influence of the stray magnetic field from neighboring cells (surrounding cells). Hereinafter, a description thereof is provided.

Figure 5:
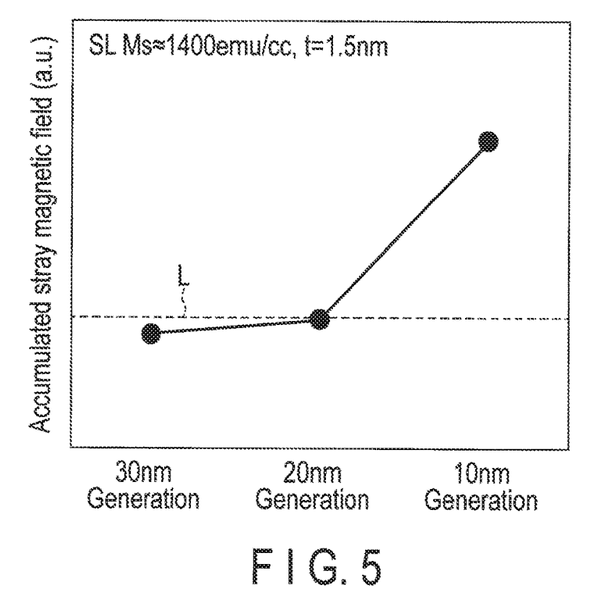
FIG. 5 is a diagram showing the relationship between the size of the magnetoresistive element and an accumulated stray magnetic field from the storage layer of neighboring cells.
Figure 6:
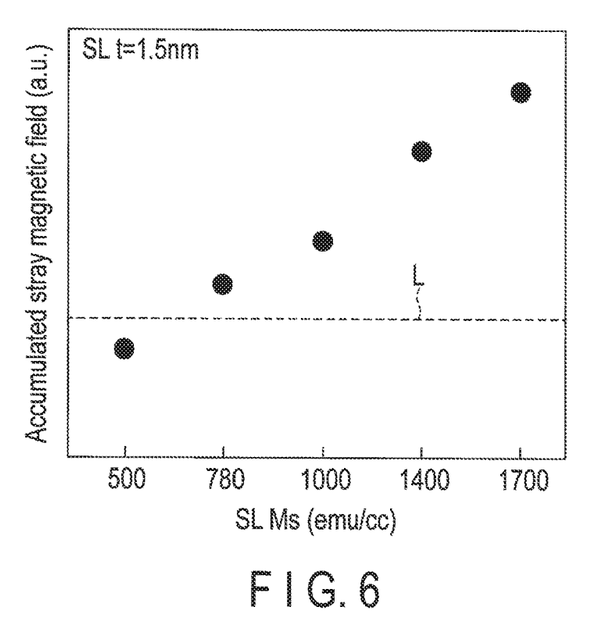
FIG. 6 is a diagram showing the relationship between saturation magnetization Ms of the storage layer and the accumulated stray magnetic field from the storage layer of neighboring cells.

FIGS. 5 and 6 show simulation results of the influence of the stray magnetic field from neighboring cells when the storage layer is formed as a single layer.

FIG. 5 is a diagram showing the relationship between the size of the magnetoresistive element and an accumulated stray magnetic field from the storage layer of neighboring cells. If the size of the magnetoresistive element reaches the 10 nm generation, the influence of the accumulated stray magnetic field from neighboring cells becomes large, which greatly exceeds the limit value L.

FIG. 6 is a diagram showing the relationship between the saturation magnetization Ms of the storage layer and the accumulated stray magnetic field from the storage layer of neighboring cells. When the saturation magnetization Ms of the storage layer increases, the influence of the accumulated stray magnetic field from neighboring cells becomes large, which greatly exceeds the limit value L.

In the present embodiment, as described above, the stray magnetic field from the storage layer can be reduced and therefore, the influence of the accumulated stray magnetic field from neighboring cells can be reduced and an excellent magnetic memory device can be obtained.

Second Embodiment

Next, a second embodiment will be described. Incidentally, basic matters are similar to those in the first embodiment and thus, the description of matters provided in the first embodiment is omitted.

Figure 7:
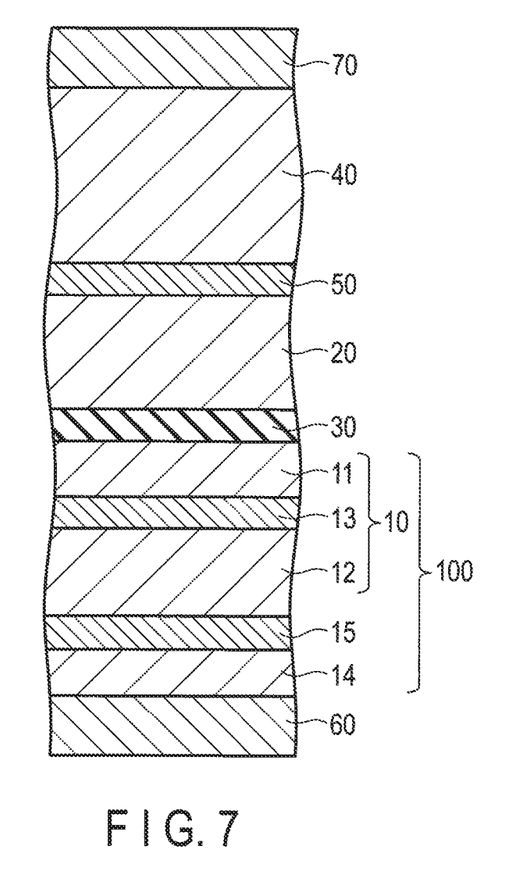
FIG. 7 is a sectional view schematically showing the configuration of a magnetic memory device according to a second embodiment.

FIG. 7 is a sectional view schematically showing the configuration of a magnetic memory device according to the present embodiment and mainly shows the configuration of a magnetoresistive element.

In the present embodiment, as shown in FIG. 7, in addition to a first sub-magnetic layer 11, a second sub-magnetic layer 12 and a first intermediate layer 13, a storage layer (first magnetic layer) 10 includes a third sub-magnetic layer 14 and a second intermediate layer 15. More specifically, the second intermediate layer 15 is provided between the second sub-magnetic layer 12 and the third sub-magnetic layer 14 and the second sub-magnetic layer 12 is provided between the first sub-magnetic layer 11 and the third sub-magnetic layer 14. The third sub-magnetic layer 14 has the magnetization direction antiparallel to the magnetization direction of the second sub-magnetic layer 12. The first sub-magnetic layer 11, the second sub-magnetic layer 12, the first intermediate layer 13, the third sub-magnetic layer 14 and the second intermediate layer 15 constitute an entire storage layer 100, and the entire storage layer 100 undergoes magnetization reversal as a whole.

Each of the first sub-magnetic layer 11, the second sub-magnetic layer 12, and the third sub-magnetic layer 14 contains at least cobalt (Co). In addition to cobalt (Co), the first sub-magnetic layer 11, the second sub-magnetic layer 12, and the third sub-magnetic layer 14 may further contain iron (Fe) or boron (B). In the present embodiment, the first sub-magnetic layer 11, the second sub-magnetic layer 12, and the third sub-magnetic layer 14 are formed of CoFeB.

Like the first intermediate layer 13, the second intermediate layer 15 contains at least one element selected from ruthenium (Ru), rhodium (Rh), osmium (Os), and iridium (Ir). A specific configuration of the second intermediate layer 15 is the same as that of the first intermediate layer 13 described in the first embodiment. The second sub-magnetic layer 12 and the third sub-magnetic layer 14 are antiferromagnetically coupled via the second intermediate layer 15.

Also in the present embodiment, like in the first embodiment, the first sub-magnetic layer 11 has a magnetization amount Mst smaller than that of the second sub-magnetic layer 12. In addition, in the present embodiment, the third sub-magnetic layer 14 has a magnetization amount Mst smaller than that of the second sub-magnetic layer 12. With the above configuration, also in the present embodiment, like in the first embodiment, the total stray magnetic field from the storage layer 10 with respect to the reference layer 20 can be reduced to zero and also, the stray magnetic field of the entire storage layer 100 (the first sub-magnetic layer 11, the second sub-magnetic layer 12, the first intermediate layer 13, the third sub-magnetic layer 14 and the second intermediate layer 15) with respect to neighboring bits can be reduced to zero. Therefore, even if the magnetoresistive element is refined, it is possible to effectively suppress the reversal of the magnetization direction of the reference layer 20. Also in the present embodiment, like in the first embodiment, the stray magnetic field from the storage layer 10 can be reduced and therefore, the influence of the accumulated stray magnetic field from neighboring cells can be reduced and an excellent magnetic memory device can be obtained.

Also in the present embodiment, the sum of the magnetization amount Mst of the first sub-magnetic layer 11 and the magnetization amount Mst of the third sub-magnetic layer 14 is preferably equal to the magnetization amount Mst of the second sub-magnetic layer 12. When the first sub-magnetic layer 11, the second sub-magnetic layer 12 and the third sub-magnetic layer 14 have the same saturation magnetization Ms, the sum of the thickness t of the first sub-magnetic layer 11 and the thickness t of the third sub-magnetic layer 14 is preferably equal to the thickness t of the second sub-magnetic layer 12. With the above configuration, it is possible to reduce the total stray magnetic field generated from the storage layer 10 to zero. Therefore, in the present embodiment, it is possible to suppress the influence of the stray magnetic field from the storage layer 10 more effectively.

In the first and second embodiments described above, the so-called bottom-free type magnetoresistive element in which the storage layer 10 is positioned below the reference layer 20 has been described, but the configuration of the storage layer 10 in the first and second embodiments described above can also be applied to a so-called top-free type magnetoresistive element in which the storage layer 10 is positioned above the reference layer 20.

Figure 8:
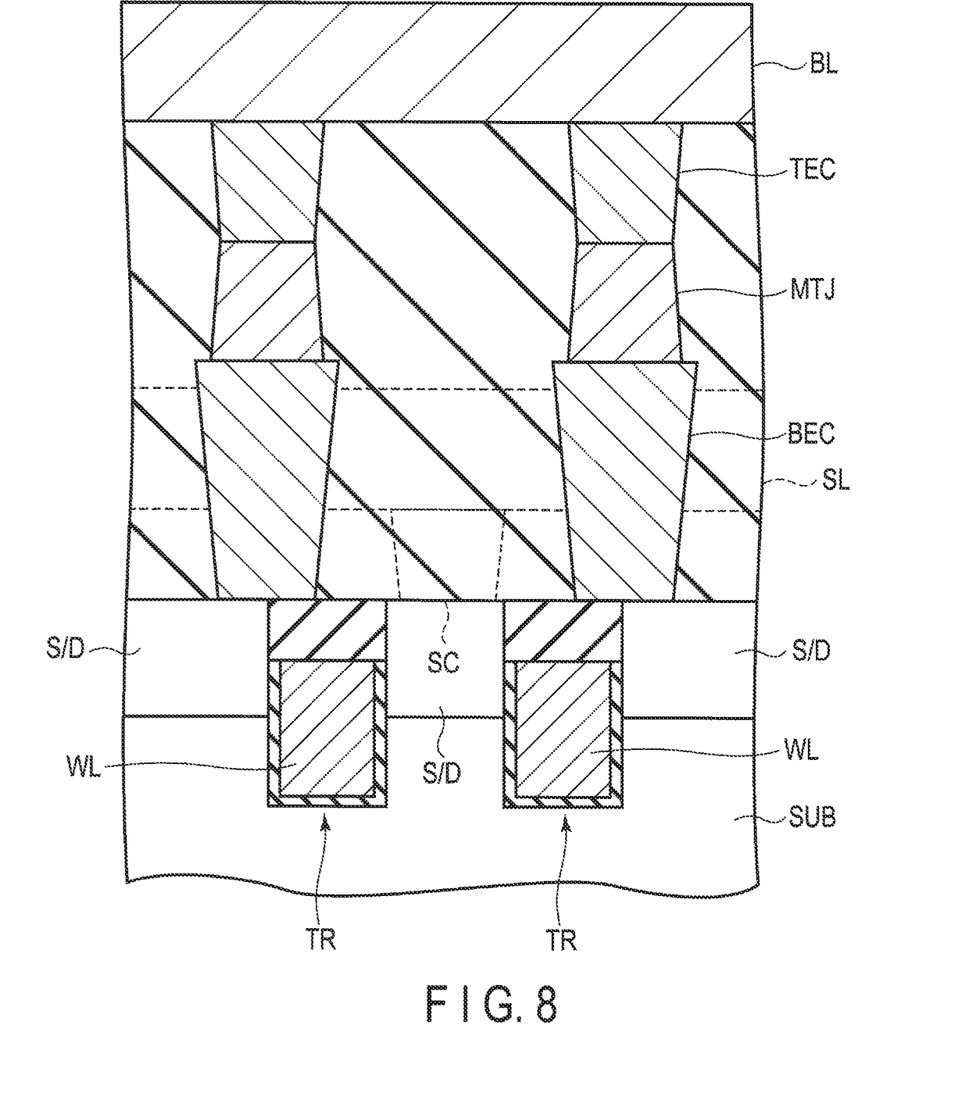
FIG. 8 is a sectional view schematically showing the configuration of a magnetic memory device using the magnetoresistive element.

FIG. 8 is a sectional view schematically showing the configuration of a magnetic memory device using the magnetoresistive element described above.

In a semiconductor substrate SUB, a buried gate type MOS transistor TR is formed. The gate electrode of the MOS transistor TR is used as a word line WL. A bottom electrode BEC is connected to one of a source/drain area S/D of the MOS transistor TR and a source line contact SC is connected to the other of the source/drain area S/D.

A magnetoresistive element MTJ is formed on the bottom electrode BEC and a top electrode TEC is formed on the magnetoresistive element MTJ. A bit line BL is connected to the top electrode TEC. A source line SL is connected to the source line contact SC.

By applying the magnetoresistive element described above to the magnetic memory device as shown in FIG. 8, an excellent magnetic memory device can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetic memory device comprising:
a first magnetic layer having a variable magnetization direction;
a second magnetic layer having a fixed magnetization direction; and
a nonmagnetic layer provided between the first magnetic layer and the second magnetic layer,
wherein:
the first magnetic layer includes a first sub-magnetic layer, a second sub-magnetic layer, a third sub-magnetic layer, a first intermediate layer provided between the first sub-magnetic layer and the second sub-magnetic layer, and a second intermediate layer provided between the second sub-magnetic layer and the third sub-magnetic layer, the first sub-magnetic layer is provided between the nonmagnetic layer and the second sub-magnetic layer and has a magnetization direction that is antiparallel to a magnetization direction of the second sub-magnetic layer and has a magnetization amount that is smaller than a magnetization amount of the second sub-magnetic layer, the third sub-magnetic layer has a magnetization direction that is antiparallel to the magnetization direction of the second sub-magnetic layer, and the second sub-magnetic layer is provided between the first sub-magnetic layer and the third sub-magnetic layer.

2. The device according to claim 1, wherein the third sub-magnetic layer has a magnetization amount that is smaller than the magnetization amount of the second sub-magnetic layer.

3. The device according to claim 1, wherein a sum of the magnetization amount of the first sub-magnetic layer and a magnetization amount of the third sub-magnetic layer is equal to the magnetization amount of the second sub-magnetic layer.

4. The device according to claim 1, further comprising:
a third magnetic layer having a fixed magnetization direction that is antiparallel to the magnetization direction of the second magnetic layer, the third magnetic layer canceling a magnetic field applied from the second magnetic layer to the first magnetic layer.

5. The device according to claim 1, wherein the first sub-magnetic layer and the second sub-magnetic layer contain at least cobalt (Co).

6. The device according to claim 1, wherein the first intermediate layer contains at least one element selected from ruthenium (Ru), rhodium (Rh), osmium (Os), and iridium (Ir).

7. A magnetic memory device comprising:
a first magnetic layer having a variable magnetization direction;
a second magnetic layer having a fixed magnetization direction; and
a nonmagnetic layer provided between the first magnetic layer and the second magnetic layer,
wherein:
the first magnetic layer includes a first sub-magnetic layer, a second sub-magnetic layer, a third sub-magnetic layer, a first intermediate layer provided between the first sub-magnetic layer and the second sub-magnetic layer, and a second intermediate layer provided between the second sub-magnetic layer and the third sub-magnetic layer,
the first sub-magnetic layer is provided between the nonmagnetic layer and the second sub-magnetic layer and has a magnetization direction that is antiparallel to a magnetization direction of the second sub-magnetic layer and has a thickness that is smaller than a thickness of the second sub-magnetic layer,
the third sub-magnetic layer has a magnetization direction that is antiparallel to the magnetization direction of the second sub-magnetic layer, and the second sub-magnetic layer is provided between the first sub-magnetic layer and the third sub-magnetic layer.

8. The device according to claim 7, wherein the third sub-magnetic layer has a thickness that is smaller than the thickness of the second sub-magnetic layer.

9. The device according to claim 7, further comprising:
a third magnetic layer having a fixed magnetization direction that is antiparallel to a magnetization direction of the second magnetic layer, the third magnetic layer canceling a magnetic field applied from the second magnetic layer to the first magnetic layer.

10. The device according to claim 7, wherein the first sub-magnetic layer and the second sub-magnetic layer contain at least cobalt (Co).

11. The device according to claim 7, wherein the first intermediate layer contains at least one element selected from ruthenium (Ru), rhodium (Rh), osmium (Os), and iridium (Ir).

12. A magnetic memory device comprising:
a first magnetic layer having a variable magnetization direction;
a second magnetic layer having a fixed magnetization direction; and
a nonmagnetic layer provided between the first magnetic layer and the second magnetic layer,
wherein:
the first magnetic layer includes a first sub-magnetic layer, a second sub-magnetic layer, a third sub-magnetic layer, a first intermediate layer provided between the first sub-magnetic layer and the second sub-magnetic layer, and a second intermediate layer provided between the second sub-magnetic layer and the third sub-magnetic layer,
the first sub-magnetic layer is provided between the nonmagnetic layer and the second sub-magnetic layer and has a magnetization direction that is antiparallel to a magnetization direction of the second sub-magnetic layer and has a saturation magnetization that is smaller than a saturation magnetization of the second sub-magnetic layer,
the third sub-magnetic layer has a magnetization direction that is antiparallel to the magnetization direction of the second sub-magnetic layer, and
the second sub-magnetic layer is provided between the first sub-magnetic layer and the third sub-magnetic layer.

13. The device according to claim 12, wherein the third sub-magnetic layer has a saturation magnetization that is smaller than the saturation magnetization of the second sub-magnetic layer.

14. The device according to claim 12, further comprising:
a third magnetic layer having a fixed magnetization direction that is antiparallel to a magnetization direction of the second magnetic layer, the third magnetic layer canceling a magnetic field applied from the second magnetic layer to the first magnetic layer.

15. The device according to claim 12, wherein the first sub-magnetic layer and the second sub-magnetic layer contain at least cobalt (Co).

16. The device according to claim 12, wherein the first intermediate layer contains at least one element selected from ruthenium (Ru), rhodium (Rh), osmium (Os), and iridium (Ir).

* * * * *